US006617261B2

(12) United States Patent
Wong et al.

(10) Patent No.: US 6,617,261 B2
(45) Date of Patent: Sep. 9, 2003

(54) STRUCTURE AND METHOD FOR FABRICATING GAN SUBSTRATES FROM TRENCH PATTERNED GAN LAYERS ON SAPPHIRE SUBSTRATES

(75) Inventors: William S. Wong, Berkeley, CA (US); David K. Biegelsen, Portola Valley, CA (US); Michael A. Kneissl, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/017,599

(22) Filed: Dec. 18, 2001

(65) Prior Publication Data

US 2003/0114017 A1 Jun. 19, 2003

(51) Int. Cl.[7] ............................................... H01L 23/48
(52) U.S. Cl. ..................................................... 438/778
(58) Field of Search ................................ 438/778, 459, 438/460, 478

(56) References Cited

U.S. PATENT DOCUMENTS

| 6,071,795 A | * | 6/2000 | Cheung et al. ............. 438/458 |
| 6,163,557 A | | 12/2000 | Dunnrowicz et al. ......... 372/46 |
| 6,261,929 B1 | * | 7/2001 | Gehrke et al. .............. 438/478 |
| 6,355,497 B1 | * | 3/2002 | Romano et al. .............. 438/39 |
| 6,365,428 B1 | * | 4/2002 | Zubrzycki et al. ............ 438/32 |
| 6,486,042 B2 | * | 11/2002 | Gehrke et al. .............. 438/462 |

\* cited by examiner

Primary Examiner—David Nelms
Assistant Examiner—Thao Le
(74) Attorney, Agent, or Firm—William Propp

(57) ABSTRACT

Gallium nitride substrates are formed by etching a gallium nitride layer on a sapphire substrate or by selective area regrowth of a gallium nitride layer first deposited onto a sapphire substrate. The gallium nitride layers are bonded to a support substrate and a laser pulse directed through the transparent sapphire detaches the gallium nitride layers from the sapphire substrate. The gallium nitride layers are then detached from the support substrate forming freestanding gallium nitride substrates.

11 Claims, 10 Drawing Sheets

STRUCTURE AND METHOD FOR FABRICATING GAN SUBSTRATES FROM TRENCH PATTERNED GAN LAYERS ON SAPPHIRE SUBSTRATES

CROSS-REFERENCE TO RELATED APPLICATIONS

The present invention is related to applications "Structure for Nitride Based Laser Diode Arrays on an Insulating Substrate", by Kneissl et al., Ser. No. 09/223,112, filed Dec. 30, 1998; "Structure for Nitride Based Laser Diode with Growth Substrate Removed", by Kneissl et al., Ser. No. 09/276,913, filed Mar. 26, 1999; "Method for Nitride Based Laser Diode with Growth Substrate Removed using an Intermediate Substrate", by Kneissl et al., Ser. No. 09/276,856, U.S. Pat. No. 6,365,428 filed Mar. 26, 1999; and "Method for Nitrid Based Laser Diode with Growth Substrate Removed" by Kneissl et al., Ser. No. 09/277,328, U.S. Pat. No. 6,448,102 filed Mar. 26, 1999; all commonly assigned to the same assignee as the present invention and herein incorporated by reference.

BACKGROUND OF THE INVENTION

The present invention relates generally to nitride based semiconductor structures, and more particularly to a method of fabricating GaN substrates from an etched striped GaN layer grown on a sapphire substrate.

Nitride based semiconductors, also known as group III nitride semiconductors or Group III–V semiconductors, comprise elements selected from group III, such as Al, Ga and In, and the group V element N of the periodic table. The nitride based semiconductors can be binary compounds such as gallium nitride (GaN), as well as ternary alloys of aluminum gallium nitride (AlGaN) or indium aluminum nitride (InGaN), and quarternary alloys such as aluminum gallium indium nitride (AlGaInN). These materials are deposited on substrates to produce layered semiconductor structures usable as light emitters for optoelectronic device applications. Nitride based semiconductors have the wide bandgap necessary for short-wavelength visible light emission in the green to blue to violet to the near ultraviolet spectrum.

The shorter wavelength blue of nitride based semiconductor laser diodes provides a smaller spot size and a better depth of focus than the longer wavelength of red and infrared (IR) laser diodes for high-resolution or high-speed laser printing operations and high density optical storage.

The primary impediment to the use of GaN as a laser structure substrate is GaN's thermal decomposition at relatively low temperatures to produce metallic Ga and $N_2$ gas. As a result, large area, freestanding GaN substrates are difficult to fabricate for nitride based semiconductor structures.

The conventional substrate material for semiconductor structures would be silicon or gallium arsenide. However, the GaN crystal structure, combined with the high GaN growth temperatures, make deposition of high-quality nitride semiconductor material directly onto semiconductor substrates such as Si or GaAs very difficult.

Nitride based semiconductor structures currently require heteroepitaxial growth of GaN thin layers onto dissimilar substrates such as sapphire or silicon carbide.

The most commonly used growth substrate, sapphire, still imposes constraints on the GaN layer quality due to the lattice and thermal-expansion coefficient mismatch between the GaN and the sapphire. The disparate properties of these two materials result in a high density of extended defects, such as dislocations and stacking faults, at the GaN thin layer/sapphire substrate interface.

Large-area (five centimeter diameter) GaN substrates can be fabricated from heteroepitaxial growth on various substrates such as sapphire or GaAs. The typical procedure involves deposition of a relatively thick GaN layer (greater than 80 $\mu$m) onto the growth substrate followed by removal of the substrate, creating a freestanding GaN substrate for the nitride based semiconductor laser diode structure.

Many substrate separation techniques are available including wet-chemical etching, chemical-mechanical polishing or laser-assisted lift-off. Wet-chemical etching and chemical-mechanical polishing are inherently slow processes that require high selectivity in materials in order to remove the original growth substrate. Laser assisted lift-off processes have several advantages over the chemically assisted methods for the GaN thin film/sapphire substrate system. The laser processing is optically selective, possesses spatial control and is a relatively fast lift-off technique.

In order for the substrate separation technique to be successfully implemented, the technique itself must not degrade the quality of the GaN layer being processed. The laser process introduces a thermoelastic stress to the GaN layer, due to the rapid heating and cooling during the pulsed irradiation, that may fracture the GaN layer. Thin film fracture may arise from microcracks within the biaxially stressed GaN or from a thermal shock initiating microcrack propagation through the GaN layer.

An inherent problem when depositing thick GaN layers heteroepitixally onto sapphire or GaAs is the intrinsic stress, compressive for sapphire and tensile for GaAs, regardless of the substrate separation technique, due to the thermal coefficient mismatch between the GaN film and the substrates.

The success of the growth substrate removal to create a GaN substrate is dictated, in part, by the quality of the as-grown GaN layer. Due to complications related to heteroepitaxy, thick GaN layers, like those needed for a substrate, generally possess microcracks that can propagate and multiply during the laser lift-off process. The combination of the intrinsic residual stress and the thermoelastic stress of the laser processing gives rise to crack propagation across the entire GaN wafer area. The crack propagation would lead to uncontrolled catastrophic mechanical failure of the GaN or, at least, ill-defined low-quality GaN substrates.

Insulating substrates allow the economical construction of nitride based semiconductor lasers and laser diode arrays. Currently, nitride based single laser structures are grown on insulating sapphire substrates. The use of insulating substrates for laser diode arrays presents a special problem in providing electrical contacts for the laser diodes. In contrast to the situation where conducting substrates are used, insulating substrates cannot provide a common backside contact for a nitride based semiconductor structure. Hence, providing electrical contacts to laser diodes on insulating substrates has required the use of both contacts on the same side of the nitride based laser diode structure.

It is an object of the present invention to provide gallium nitride substrates from a trench patterned gallium nitride layer of a sapphire substrate.

SUMMARY OF THE INVENTION

According to the present invention, a gallium nitride layer is grown initially on a sapphire substrate. A mask layer, such as photoresist, a metal layer or a dielectric layer, is patterned into stripes on the gallium nitride layer. The gallium nitride layer is then etched down to the sapphire substrate to form trenches creating sectioned areas of gallium nitride on the sapphire substrate. Alternatively, trenches can be obtained by selective-area regrowth on a pre-patterned gallium nitride layer on the sapphire substrate.

The gallium nitride substrates are bonded to a silicon support substrate. Freestanding gallium nitride substrates are then fabricated using a laser lift-off process to remove the sapphire substrate and a solvent to remove the support substrate.

The edges of the gallium nitride substrates along the trenches act as terminating surfaces for cracks and defects, which originate during the growth of the gallium nitride layer, or that may propagate during the separation of the gallium nitride from the sapphire growth substrate.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof. In addition, the figures are not drawn to scale for ease of understanding the present invention.

Figure 1:
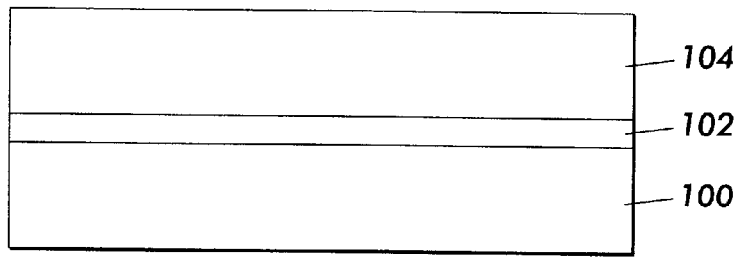
FIG. 1 is a side view of a gallium nitride layer on a sapphire substrate in accordance with a first embodiment of the present invention.

Reference is now made to FIG. 1, wherein there is illustrated a gallium nitride GaN layer on a sapphire $Al_2O_3$ substrate in accordance with this invention. Gallium nitride is grown on a sapphire substrate by techniques such as organometallic vapor phase epitaxy ("OMVPE") or hydride vapor phase epitaxy ("HVPE") as is well-known in the art.

OMVPE growth is typically performed on 5 to 7.5 cm diameter sapphire substrate 100. The substrate 100 can be a C-face (0001) or A-face (1120) oriented sapphire ($Al_2O_3$) substrate. The sapphire substrate 100 is of standard specifications including an epitaxial polish on one or both sides and a typical thickness ranging on the order of 200 $\mu$m to 1000 $\mu$m.

A gallium nitride nucleation layer 102 is first grown on the sapphire substrate 100. A gallium nitride layer 104 is then grown on the nucleation layer 102.

The substrate temperatures during growth are typically 550 degrees C. for the approximately 200 Angstrom thin GaN nucleation layer 102 and 1000 degrees C. to 1200 degrees C. for the GaN layer 104. The deposition rates are typically in the order of 1 $\mu$m/hour to 20 $\mu$m/hour. The thick GaN layer 104 has typically a depth ranging between 60 $\mu$m to 300 $\mu$m In addition, the reactor pressure may be controlled between 50 Torr and 1500 Torr. As organometallic precursors, TMGa (trimethylgallium) or TEGa (triethylgallium) can be used for the group III elements and $NH_3$ (ammonia) can be used as the nitrogen source Hydrogen and/or nitrogen are used as carrier gas for the metalorganic sources.

If the gallium nitride substrate is required to be conductive, then the GaN layer 104 can be doped during OMVPE growth with e.g. Si to make it n-type or Mg to make it p-type. The dopant concentration is typically in the range of $10^{16} cm^{-3}$ to $10^{20}$ $cm^{-3}$. For the n-doping, 100 ppm $SiH_4$ diluted in $H_2$ and, for the p-doping, $Cp_2Mg$ (cyclopentadienylmagnesium) is used. Other examples of p-type dopants include, but are not limited to, Mg, Ca, C and Be. Examples of n-type dopants include, but are not limited to, Si, O, Se, Te and N-vacancies.

Another deposition technique for the growth of a thick GaN layer well known in the art is HVPE. HVPE growth is also typically performed on 5 to 7.5 cm diameter sapphire substrate wafer. The substrate 100 can be a C-face (0001) or A-face (1120) oriented sapphire ($Al_2O_3$) substrate. However, other substrate orientations may also be used. The substrate temperatures during growth are typically 500 to 600 degrees C. for the thin GaN nucleation layer 102 and 1000 degrees C. to 1200 degrees C. for the thick GaN layer 104. The deposition rates are typically in the order of 10 $\mu$m/hour up to several 100 $\mu$m/hour. The thick GaN layer 104 has typically a depth ranging between 60 $\mu$m to 300 $\mu$m. In addition, the reactor pressure may be controlled between 50 Torr and 1500 Torr. GaCl is used as group III element source, which is produced by flowing HCl gas over liquid gallium. $NH_3$ (ammonia) is used as the nitrogen source. Hydrogen and/or nitrogen are used as carrier gases.

In principle, other deposition methods like molecular beam epitaxy ("MBE") could be used, although the relatively small deposition rates of MBE would make it difficult to grow thick GaN layers. One can also use a combination of the above mentioned deposition techniques. For example OMVPE could be used to grow a high quality GaN nucleation layer 102 with a depth of approximately 1–2 $\mu$m and HVPE can be used subsequently to grow the very thick GaN layer 104 on top of the nucleation layer 102.

Figure 2:
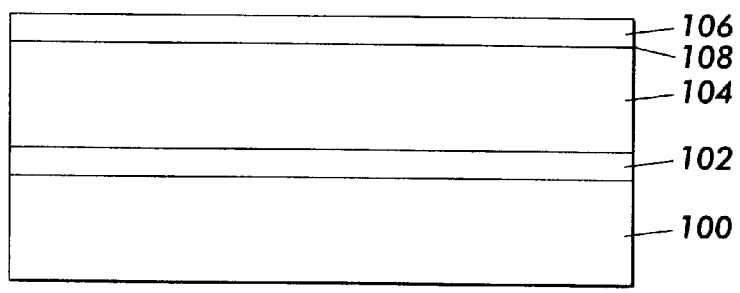
FIG. 2 is a side view of an etch mask layer, such as photoresist, on the gallium nitride layer/sapphire substrate of FIG. 1.

A 200 nm thick silicon dioxide $SiO_2$ etch mask layer 106 is then deposited on the upper surface 108 of the GaN layer 104 by plasma-enhanced chemical vapor deposition ("PECVD") or by electron beam evaporation as shown in FIG. 2. The etch mask layer can be a photosensitive polymer such as photoresist, or a metal layer such as nickel or tungsten, or a dielectric material layer such as the silicon dioxide or silicon nitride or siliconoxy-nitride.

Figure 3:
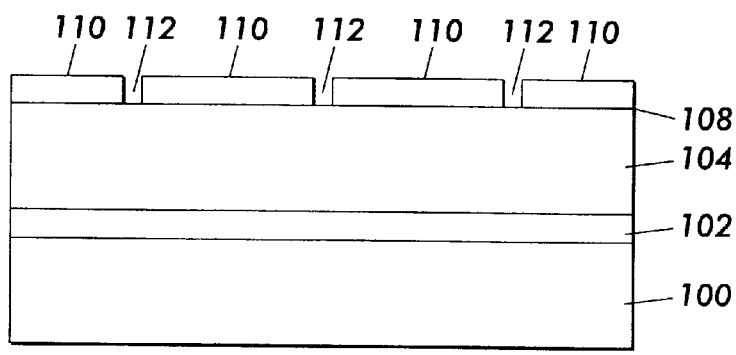
FIG. 3 is a side view of the etch mask stripes after patterning on the gallium nitride layer/sapphire substrate.

The dielectric layer 106 is then patterned by using standard photolithographic procedures and etched, for example with dry-etching techniques such as chemical-assisted ion beam etching (CAIBE), reactive ion etching (RIE) or by wet-etching with hydrofluoric acid (HF) to form stripes 110 on the upper surface 108 of the GaN layer 100 as seen in FIG. 3. The stripes 110 are separated by the patterned etched openings 112 with a width of 100 angstroms to 1 micron.

The parallel stripes 110 are typically 200 to 1000 microns in width, wide enough to form a discontinuity along the GaN layer. The strip length can be chosen to fit a specific dimension or can extend from one edge to the other of the substrate with openings 112 separating the stripes 110. The stripes protect the unetched sections of the GaN layer which will later be separated from the sapphire substrate to form the GaN substrates of the present invention.

Figure 4:
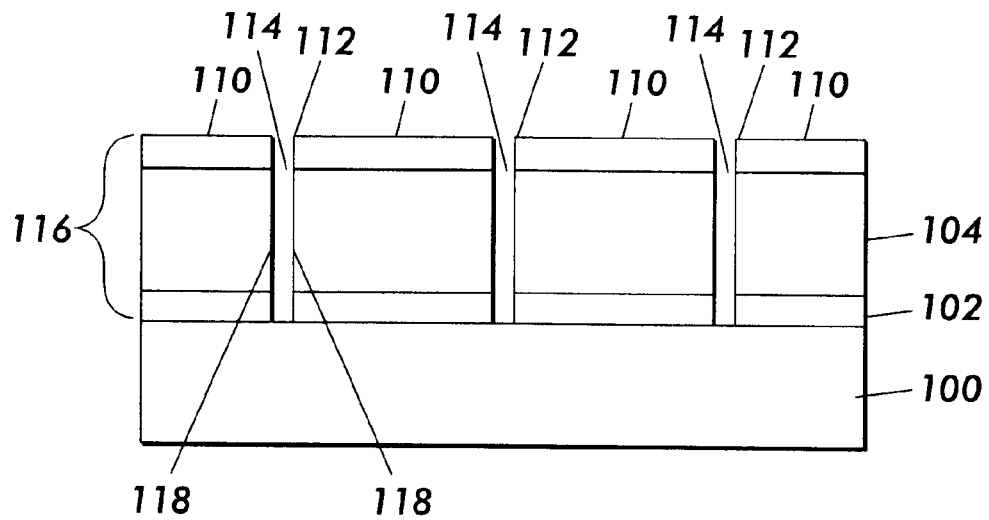
FIG. 4 is a side view of the etched trenches through the gallium nitride layer to the sapphire substrate, after removal of etch masks.

In FIG. 4, wet chemical or dry etching is then used to etch away the GaN layer 104 at the openings 112 between the stripes 110 to form trenches 114. The trenches 114 are etched through the depth of the GaN layers 104 and 102 down to the sapphire substrate 100. Dry etching can be performed using CAIBE, or reactive ion etching (RIE), or inductive-coupled plasma etching (ICP) in an $Ar/Cl_2/BCl_3$ gas mixture, while photo-enhanced wet-chemical etching can be performed with potassium hydroxide (KOH) and a ultraviolet light source.

The resulting etched trenches 114 separate the individual GaN substrates 116. The individual gallium nitride substrates 116 are the unetched gallium nitride layers 102 and 104 under the mask layer stripes 110. The etch mask layer 110 is removed from the upper surface 108 of each GaN substrate using common solvents such as acetone or plasma etching in an oxygen ambient.

The sidewalls 118 of the individual substrates 116 formed by the etching of the trenches 114 alleviate the compressive stress of the thick gallium nitride layer 104 and provide termination points for any microcracks within the individual substrates. The width of the trenches 114 is the same as the width of the patterned etched openings 112, i.e. 100 angstroms to 1 micron. The trench width merely needs to be sufficient to separate the sidewalls 118 and the individual substrates 116.

Figure 5:
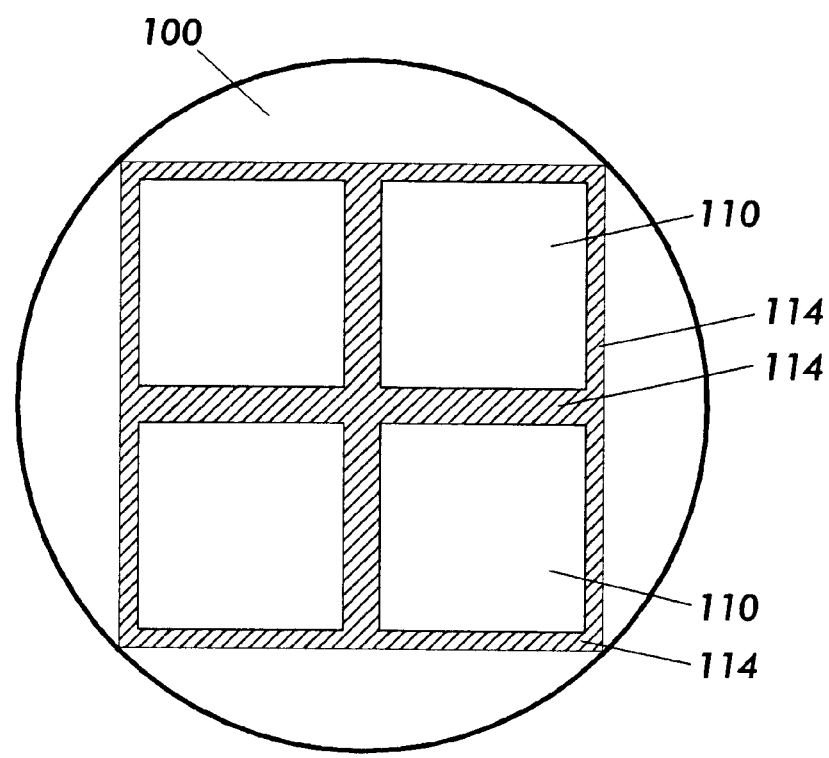
FIG. 5 is a top view of the etch mask layer stripe pattern of FIG. 4.

The etch mask layer stripes 110 can be laid out in parallel, or as shown in FIG. 5, in a cross-hatch or orthogonal pattern on the upper surface 108 of the GaN layer 104. The orthogonal stripe pattern would, in addition to alleviating compressive stress and providing microcrack termination, also allow the alleviation of the biaxial residual compressive stress and create additional free surfaces from the trench sidewalls 118, perpendicular to the original growth surface 108, while maximizing the size of the final freestanding GaN substrates 116.

Figure 6:
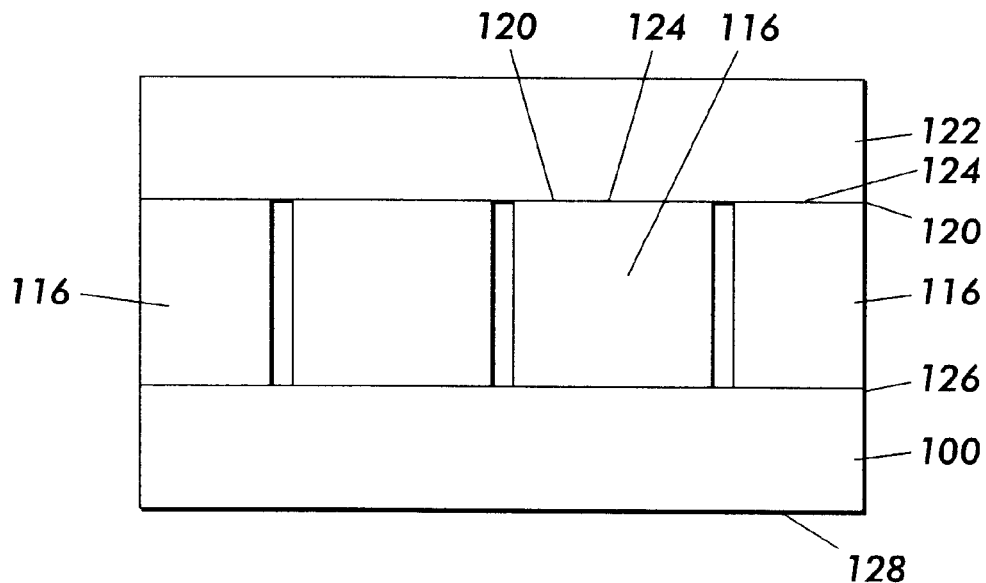
FIG. 6 is a side view of the support substrate bonded to the trench patterned gallium nitride substrates on the sapphire substrate.

In FIG. 6, the upper surfaces 120 of the GaN substrates 116 are bonded to a silicon (Si) support substrate 122 using an adhesive bond 124. The adhesive 124 may be a cyanoacrylate-based glue. The support substrate could alternatively be gallium arsenide (GaAs) or any rigid material.

The GaN substrates 116 are attached by their lower surfaces 126 to the sapphire substrate 100 and attached by their upper surfaces 120 to the support substrate 122. The lower surface 128 of the sapphire substrate 100 (on the side opposite the GaN substrates 116) is polished to a very smooth surface finish to minimize light scattering. Polishing is accomplished mechanically using a succession of diamond pads (not shown). During the polishing procedure, the diamond grit size is gradually reduced from a grit size of about 30 $\mu$m down to a grit size of 0.1 $\mu$m Typical root mean square (rms) roughness after polishing is about 20–50 Angstrom. Polishing may be done before bonding to the support substrate.

Figure 7:
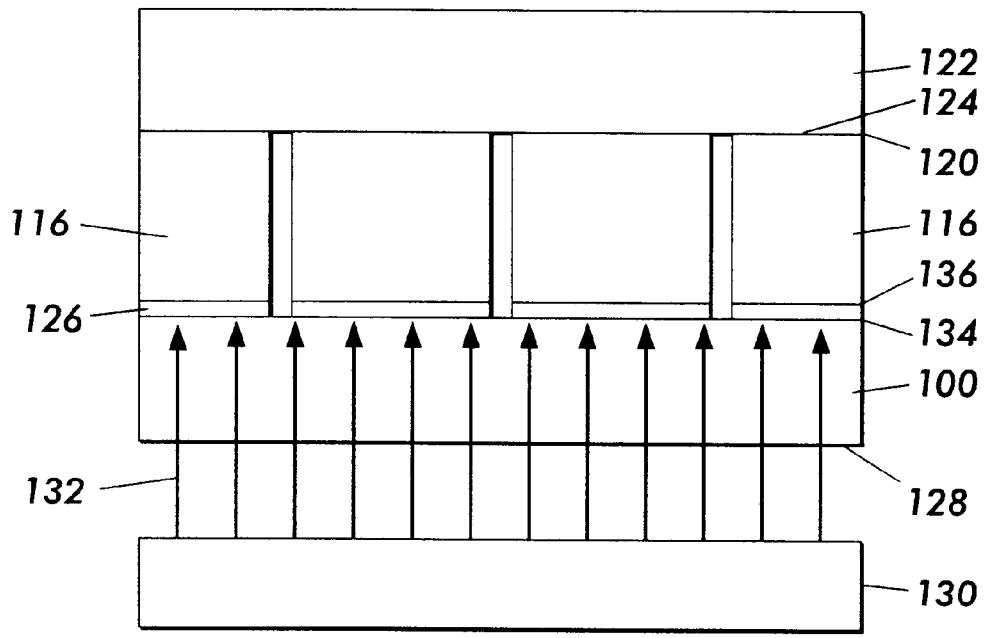
FIG. 7 is a side view of the laser lift-off process for removing the sapphire substrate from the trench patterned gallium nitride substrates bonded to the support substrate.

As shown in FIG. 7, an ultraviolet excimer laser 130 then emits a laser beam 132 which is transmitted through the sapphire substrate 100 to the interface 134 between the sapphire substrate 100 and the GaN substrates 116. Sapphire is transparent to the wavelength of the light beam emitted by the laser.

Proper adjustment of the excimer laser allows decomposition of a thin GaN layer 136 (which is part of the original GaN nucleation layer 102) at the interface 134 between the sapphire substrate 100 and the GaN substrate 116. The GaN layer 136 is decomposed into Ga metal and $N_2$ by the radiation from the laser beam through the sapphire substrate.

As an illustrative example, an XeCl excimer laser operating at 308 nm will emit a laser beam with an energy range from about 400–500 $mJ/cm^2$ with a beam size of 4 mm by 4 mm after passage through a homogenizer. A homogenizer (not shown) converts the Gaussian-profile beam emitted by the laser to a flat plateau-like laser beam which provides improved beam uniformity.

A larger surface area of the GaN substrates may be exposed by scanning the laser beam across the interface surface rather than providing a stationary beam. The excimer laser is typically pulsed in the range of 5–10 Hz with one pulse typically being sufficient to achieve decomposition of the GaN layer. The polished lower surface 128 of the sapphire substrate 100 allows uniform excimer laser exposure of the GaN layer 136.

Absorption of the laser beam at the GaN substrate/sapphire substrate interface 134 heats the entire structure 100 and 116 until the interface 134 is above 30° C., the melting point of gallium which decomposes the thin GaN layer 136 into Ga metal and $N_2$. After separation of the GaN substrates from the sapphire substrate, any residual Ga metal on the lower surface 126 of the GaN substrate 116 is removed with a hydrochloric acid (HCL) and water solution dip (HCL:$H_2O$=1:1).

To repair any surface damage due to the laser assisted lift-off technique and the hydrochloric acid dip, approximately 0.5 to 1 μm of the lower surface 126 of the GaN substrate 116 is removed by dry-etching in a Ar/$Cl_2$/$BCl_3$ gas mixture. Typically, CAIBE or RIE is used for the dry-etch. Low energy (less than about 400 ev) Ar ion sputtering is employed after the dry-etch to reduce the surface damage caused by the dry-etching.

Figure 8:
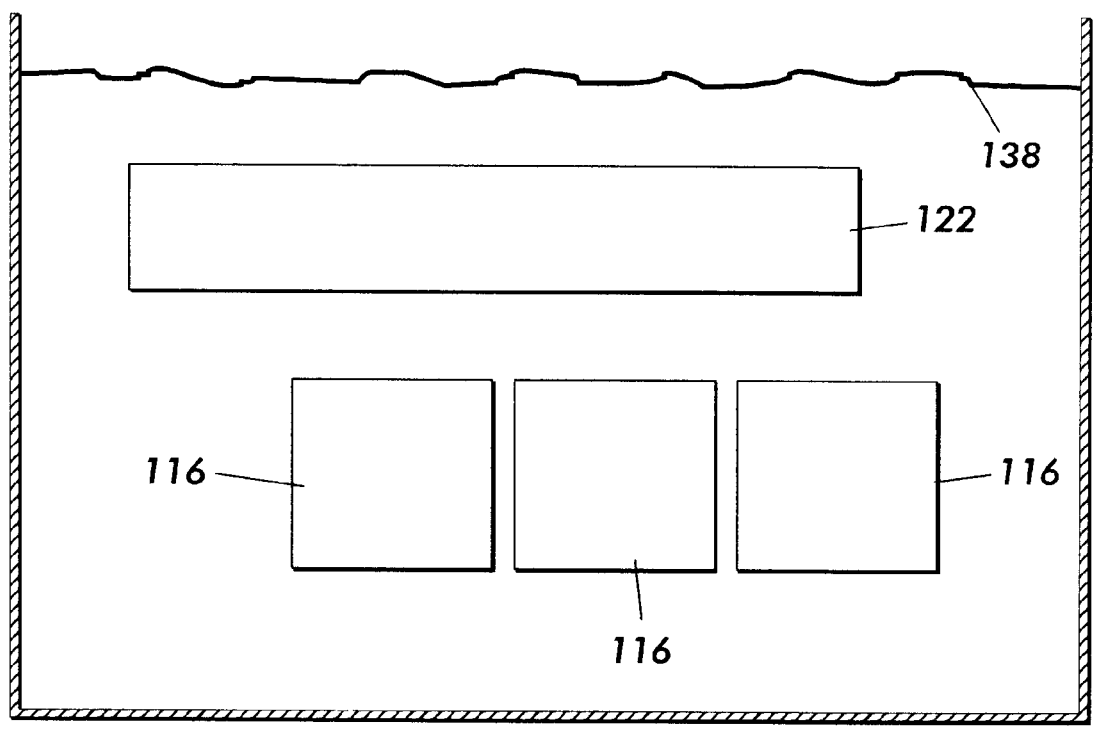
FIG. 8 is a side view of the separation of the gallium nitride substrates from the support substrate.

As seen in FIG. 8, the GaN substrates/support substrate structure is immersed in an organic solvent 138 such as acetone to release the GaN substrates 116 from the support substrate 122. The GaN substrates 116 are then cleaned by standard wafer-cleaning processes to prepare the substrates for deposition of subsequent nitride based semiconductor layers to form semiconductor device structures.

The sapphire substrate 100 is reusable for subsequent fabrication of GaN substrates. The substrate 100 can be any optically transparent material which is transmissive to the wavelength of the light beam 132 from the laser 130 and suitable for growth of GaN layers on its surface.

An alternate method of fabricating GaN substrates is selective area re-growth of thick GaN layers on patterned thin GaN layers on a sapphire substrate which form trenches between the GaN substrates without etching.

Figure 9:
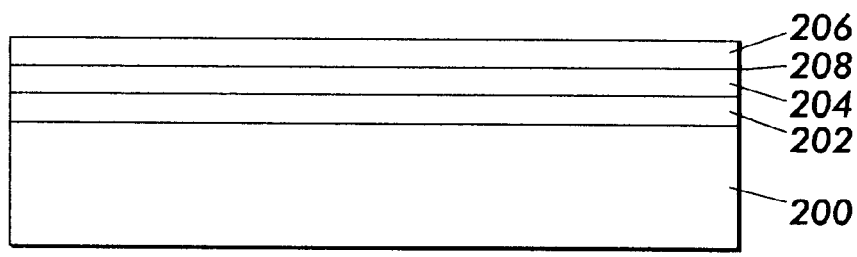
FIG. 9 is a side view of a gallium nitride layer and etch mask layer on a sapphire substrate in accordance with a second embodiment of the present invention.

Reference is now made to FIG. 9, wherein there is illustrated selective area re-growth of gallium nitride on a sapphire substrate in accordance with this invention. The 5 to 7.5 cm diameter substrate 200 can be a C-face (0001) or A-face (1120) oriented sapphire ($Al_2O_3$) substrate with a typical thickness ranging on the order of 200 μm to 1000 μm.

An approximately 200 Angstrom thin gallium nitride nucleation layer 202 is grown on the sapphire substrate 200. An approximately 2 μm gallium nitride layer 204 is then grown on the nucleation layer 102. Growth of the GaN layers is by OMVPE or HVPE, as discussed previously in this application.

A 100 nm thick silicon dioxide $SiO_2$ dielectric layer 206 is then deposited on the upper surface 208 of the GaN layer 204 by plasma-enhanced chemical vapor deposition ("PECVD") or chemical vapor deposition ("CVD"). The dielectric layer can also be silicon nitride or silicon-oxynitride. Alternatively a metal layer such as tungsten can be used as masking material for selective area re-growth.

Figure 10:
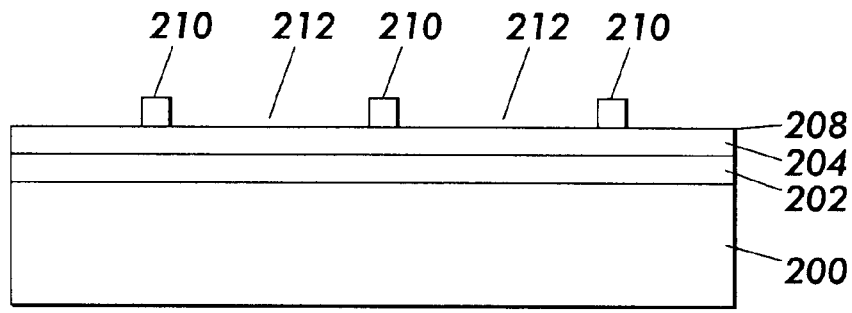
FIG. 10 is a side view of the silicon dioxide stripes after patterning on the gallium nitride layer/sapphire substrate of FIG. 9.

The silicon dioxide dielectric layer 206 is then patterned by using standard photolithographic procedures and wet-etching with hydrofluoric acid (HF) or dry-etching techniques such as chemical-assisted ion beam etching (CAIBE) or reactive ion etching (RIE) to form stripes 210 on the upper surface 208 of the GaN layer 204 as seen in FIG. 10.

Figure 11:
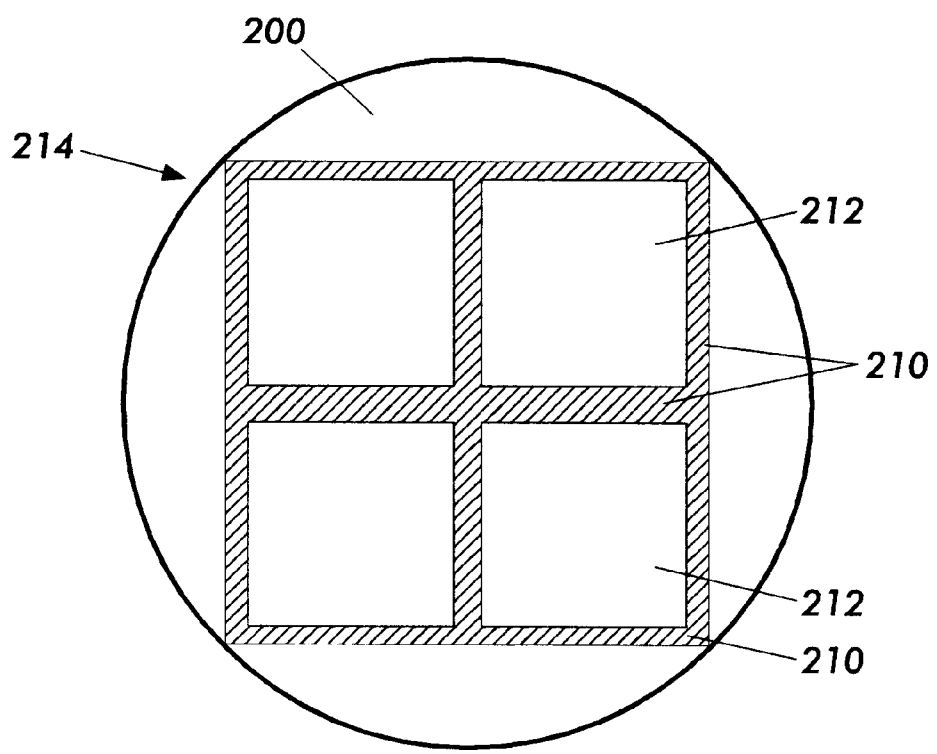
FIG. 11 is a top view of the etch mask layer stripe pattern of FIG. 9.

The stripes 210 are typically 200 to 1000 microns in width and are wide enough that the subsequently regrown GaN layer does not completely overgrow the stripes. The openings 212 in the silicon dioxide $SiO_2$ dielectric stripes 210 extend down to the upper surface 208 of the GaN layer 204. The square-shaped stripe pattern 214 of FIG. 11 defines the area over which the homogeneous GaN layer is subsequently regrown and are typically in the order of 0.5 to 5 cm in each direction. The openings form the sections of the second subsequently regrown GaN layer which will later be separated from the sapphire substrate to form the GaN substrates of the present invention. The stripe pattern can also assume other shapes (e.g. rectangular, hexagonal) suitable to define an enclosed area on the substrate.

Figure 12:
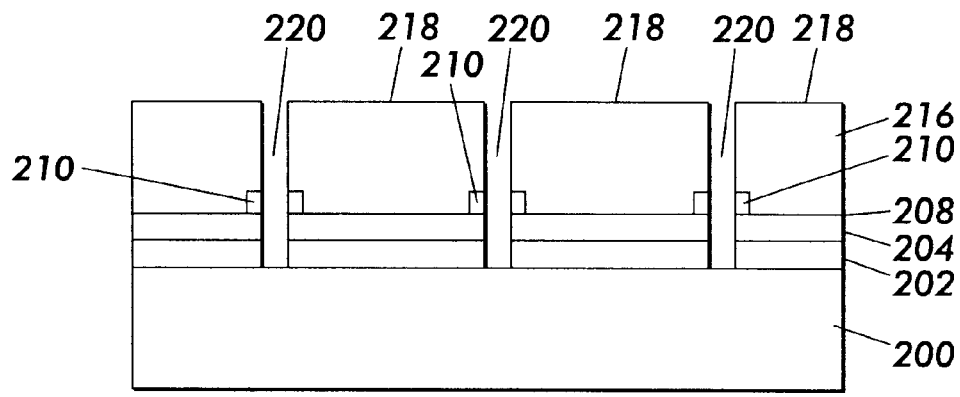
FIG. 12 is a side view of the selective area regrowth of gallium nitride substrates separated by trenches on the gallium nitride layer/sapphire substrate.

As seen in FIG. 12, a second thick GaN layer 216 is grown on the upper surfaces 208 of the GaN layer 204 through the openings 212 between the parallel dielectric stripes 210 by either OMVPE or HVPE.

The second GaN layer 216 has a depth of approximately 60 to 300 μm. The dielectric stripes 210 are wide enough that the second GaN layer 216 does not completely overgrow the stripes but rather the GaN layer 216 forms the GaN substrates 218. By not completely overgrowing the stripes, the GaN substrates 218 will be separated by trenches 220 formed from the incomplete coalescence of the second GaN layer. The width of the trenches 220 is approximately 100 angstroms to 1 micron. The trench width merely needs to be sufficient to separate the individual substrates 218. In order to completely separate the GaN substrate templates 218, the trenches 220 formed from the incomplete coalescence of the second GaN layer can be extended down to the sapphire substrate by etching through the dielectric stripes 210 and the GaN layers 204 and 202 using dry-etching techniques like CAIBE or RIE.

Typical lateral distance-to-vertical height growth rates for gallium nitride are in the order of 0.5:1 to 3:1, depending on the growth temperature, the growth reactor pressure and the orientation of the stripes relative to the crystal orientation of the GaN. Consequently, the silicon dioxide stripe width needs to be one to six times larger than the thickness of the overgrown GaN layer in order to prevent coalescence of the overgrown GaN layer into a single layer rather than separate and discrete GaN substrates.

Figure 13:
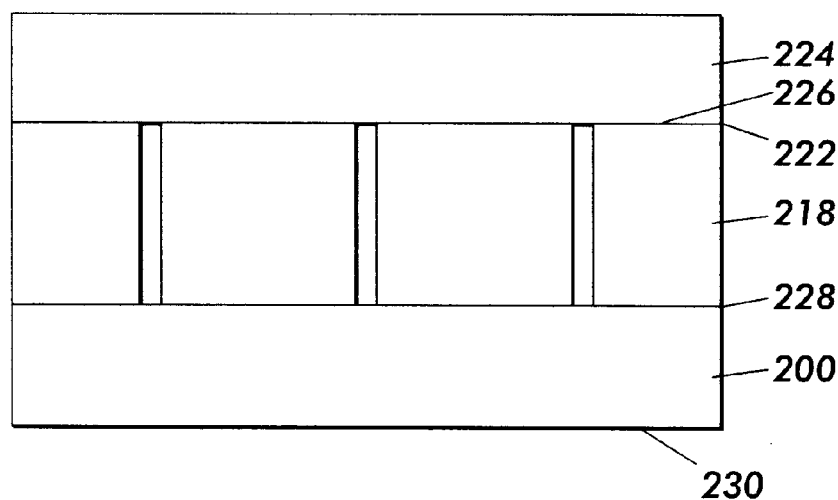
FIG. 13 is a side view of the support substrate bonded to the trench patterned gallium nitride substrates on the sapphire substrate.

In FIG. 13, the upper surfaces 222 of the GaN substrates 218 are bonded to a silicon (Si) support substrate 224 using an adhesive bond 226 such as a cyanoacrylate-based glue. The support substrate can alternatively be gallium arsenide (GaAs) or any rigid material.

The GaN substrates 218 are attached by their lower surfaces 228 to the sapphire substrate 200 and attached by their upper surfaces 222 to the Si support substrate 224. The lower surface 230 of the sapphire substrate 200 (on the side opposite the GaN substrates 218) is polished to a very smooth surface finish to minimize light scattering.

Figure 14:
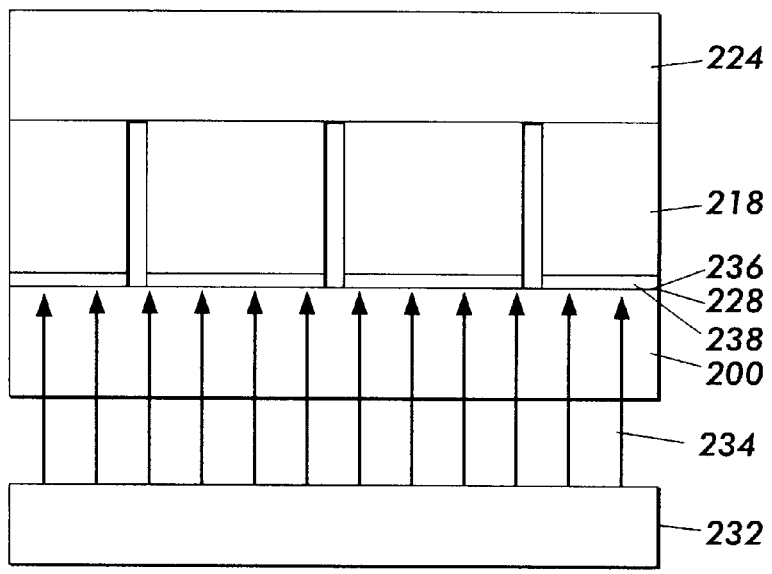
FIG. 14 is a side view of the laser lift-off process for removing the sapphire substrate from the trench patterned gallium nitride substrates bonded to the support substrate.

As shown in FIG. 14, an ultraviolet excimer laser 232 then emits a laser beam 234 which is transmitted through the sapphire substrate 200 to the interface 236 between the sapphire substrate 200 and the GaN substrates 218.

Proper adjustment of the excimer laser allows decomposition of a thin GaN layer 238 (which is part of the original GaN nucleation layer 202) at the interface 236 between the sapphire substrate 200 and the GaN substrate 218. The GaN layer 238 is decomposed into Ga metal and $N_2$ by the radiation from the laser beam through the sapphire substrate.

Absorption of the laser beam at the GaN substrate/sapphire substrate interface 236 heats the entire structure 200 and 218 until the interface 236 is above 30° C., the melting point of gallium which decomposes the thin GaN layer 238 into Ga metal and N$_2$. After separation of the GaN substrates from the sapphire substrate, any residual Ga metal on the lower surface 228 of the GaN substrate 218 is removed with a hydrochloric acid (HCl,) and water solution dip (HCL:H$_2$O=1:1).

Figure 15:
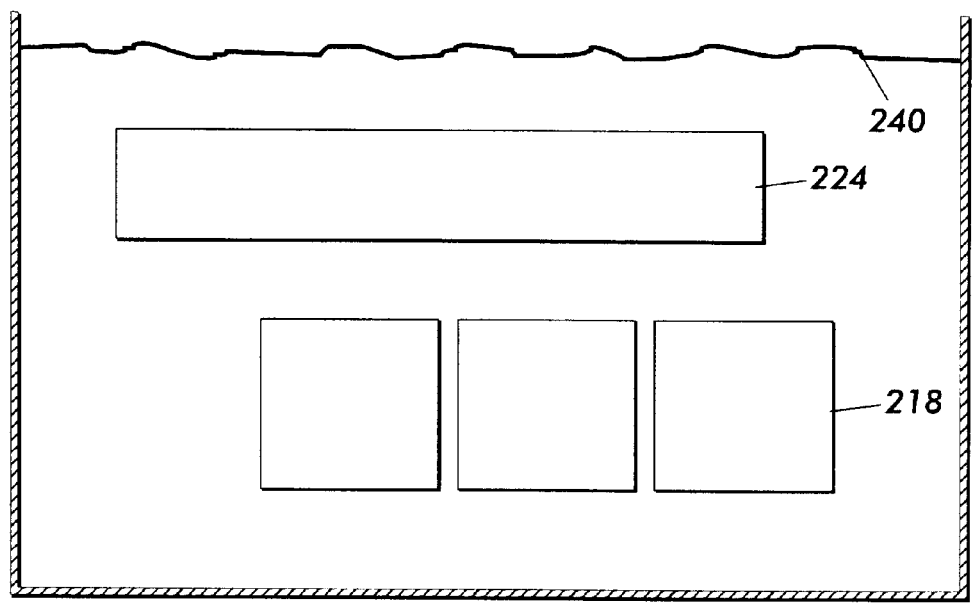
FIG. 15 is a side view of the separation of the gallium nitride substrates from the sapphire substrate.

As seen in FIG. 15, the GaN substrates/support substrate structure is immersed in an organic solvent 240 to release the GaN substrates 218 from the support substrate 224. The GaN substrates 218 are then cleaned by standard wafer-cleaning processes to prepare the substrates for deposition of subsequent nitride based semiconductor layers to form semiconductor structures. The sapphire substrate 200 is reusable for subsequent fabrication of GaN substrates.

The GaN substrates 218 can be doped, either n-type or p-type, during OMPVE growth if the substrates are required to be conductive, as previously described in this application.

Figure 16:
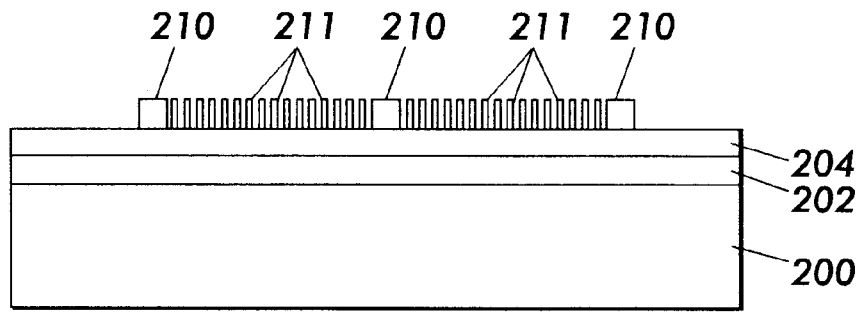
FIG. 16 is a side view of another set of silicon dioxide stripes after patterning on the gallium nitride layer/sapphire substrate of FIG. 9.
Figure 17:
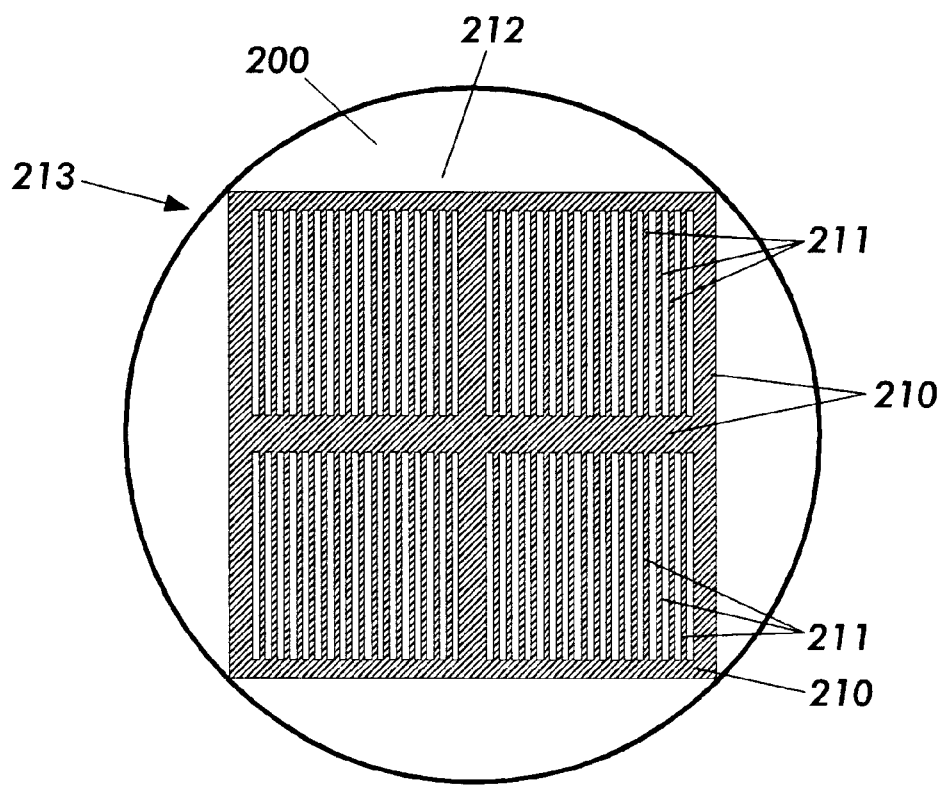
FIG. 17 is a top view of the etch mask layer stripe pattern of FIG. 16.

Alternately, during the selective area regrowth process, after deposition of the GaN layers 202 and 204 on the sapphire substrate 200, a second set of narrow silicon dioxide stripes 211 in pattern 213 can be utilized in order to facilitate epitaxial lateral overgrowth (ELO) for the reduction of the dislocation density in the GaN layers as shown in FIGS. 16 and 17.

Figure 18:
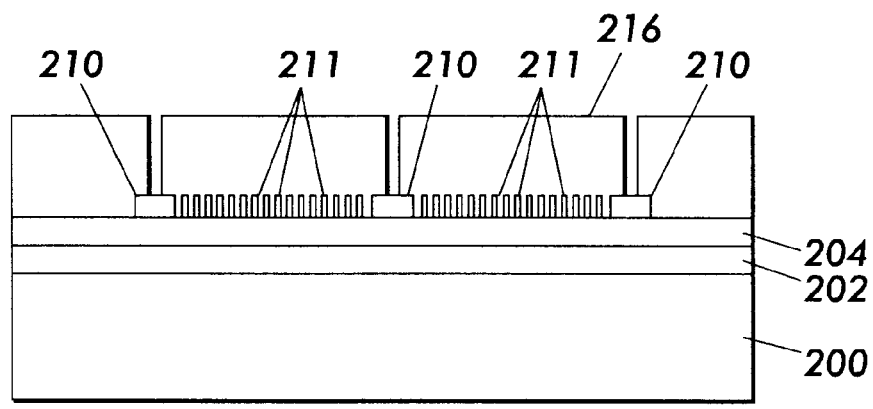
FIG. 18 is a side view of the selective area regrowth of gallium nitride substrates separated by trenches on the gallium nitride layer/sapphire substrate of FIG. 16.

The width of the silicon dioxide stripes 211 for ELO would be typically in the order of 10 μm with periods of 12 μm. The ELO silicon dioxide stripes 211 would extend in length the entire length of the square-shaped SiO$_2$ pattern 212 and fit within the larger stripes 210 in the square pattern 210. The ELO silicon dioxide stripes 211 are preferable oriented in the [10-10] direction of the GaN layer 204 to facilitate maximum reduction in dislocation density. As shown in FIG. 18, the second silicon dioxide stripes 211 are narrow enough so that the stripes 211 are completely overgrown after the re-growth of the second thick GaN layer 216.

Figure 19:
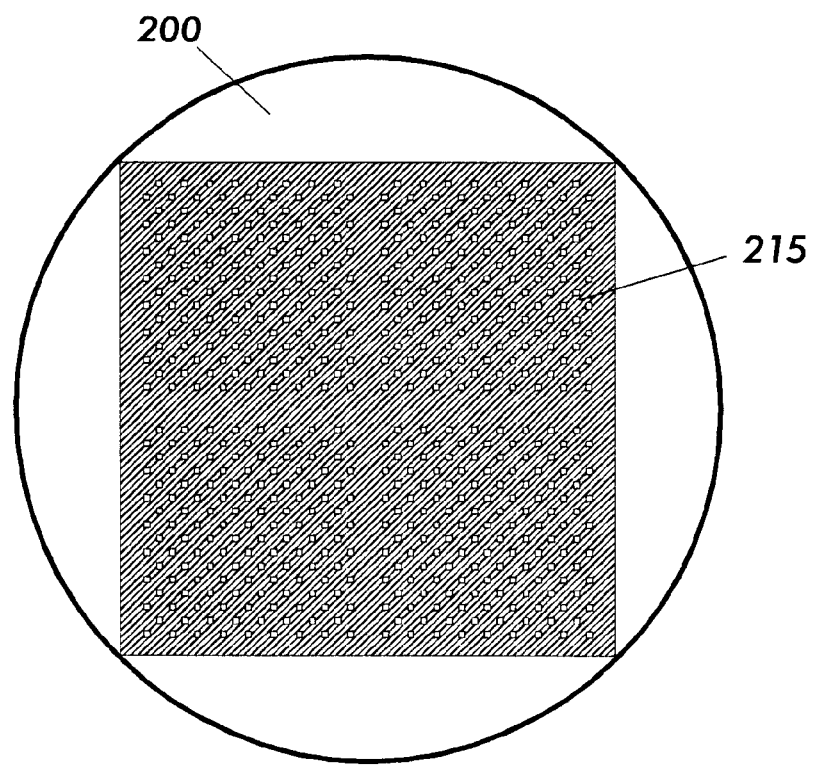
FIG. 19 is a top view of another etch mask layer stripe pattern.

Alternatively, another ELO pattern 215 in FIG. 19 (e.g. a matrix of 2 micron diameter circular openings on a 4 micron pitch on a surface otherwise completely covered with SiO$_2$) can also be used to realize epitaxial lateral overgrowth with reduced dislocation denisity.

Figure 20:
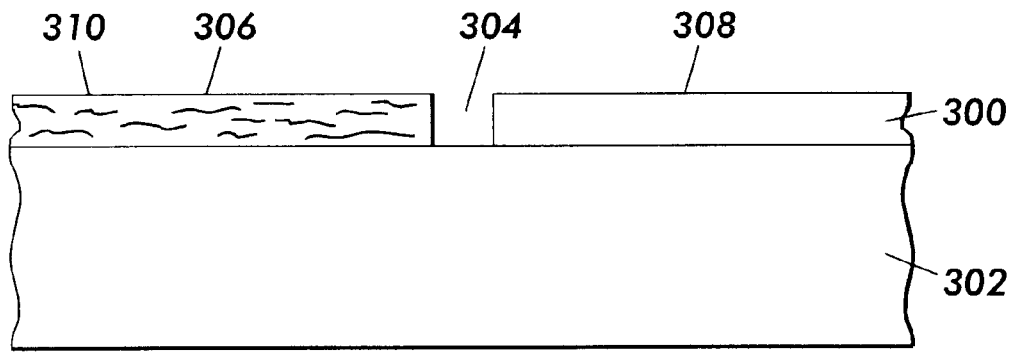
FIG. 20 is a side view of microcracks in gallium nitride substrates on a sapphire substrate.

A GaN layer 300 is deposited on a sapphire substrate 302 in the simplified structure of FIG. 20. A trench 304 separates the first GaN substrate 306 from the second GaN substrate 308. The first GaN substrate 306 and the second GaN substrate 308 are formed from the GaN layer 300. The trench 304 can be fabricated by etching or incomplete selective area regrowth. Microcracks 310 can occur in the first GaN substrate 306 due to the heteroepitaxy which is deposition of one semiconductor material on a different material, gallium nitride on sapphire in this instance or due to the thermal-expansion coefficient mismatch between the two different materials GaN and sapphire. The trench 304 between the first and second GaN substrates terminates the cracks 310 in the first substrate 306 from continuing on into the second GaN substrate 308. The first substrate 306 will be discarded later but the second substrate 308 can be used later for optoelectronic semiconductor structures.

A sufficiently thick GaN layer which has been vapor phase epitaxy deposited on a sapphire substrate may exhibit a large curvature due to residual stress in the GaN layer. Catastrophic cracking and reproducibility is a concern when dealing with the high (>8 GPa) compressive stress within the GaN layer. A trench or a set of parallel trenches across the diameter of the GaN layer would help to alleviate the compressive stress and partially remove the bowing of the substrate. An orthogonal trench or a set of parallel orthogonal trenches would alleviate the bowing in the orthogonal direction associated with the biaxial residual stress.

Figure 21:
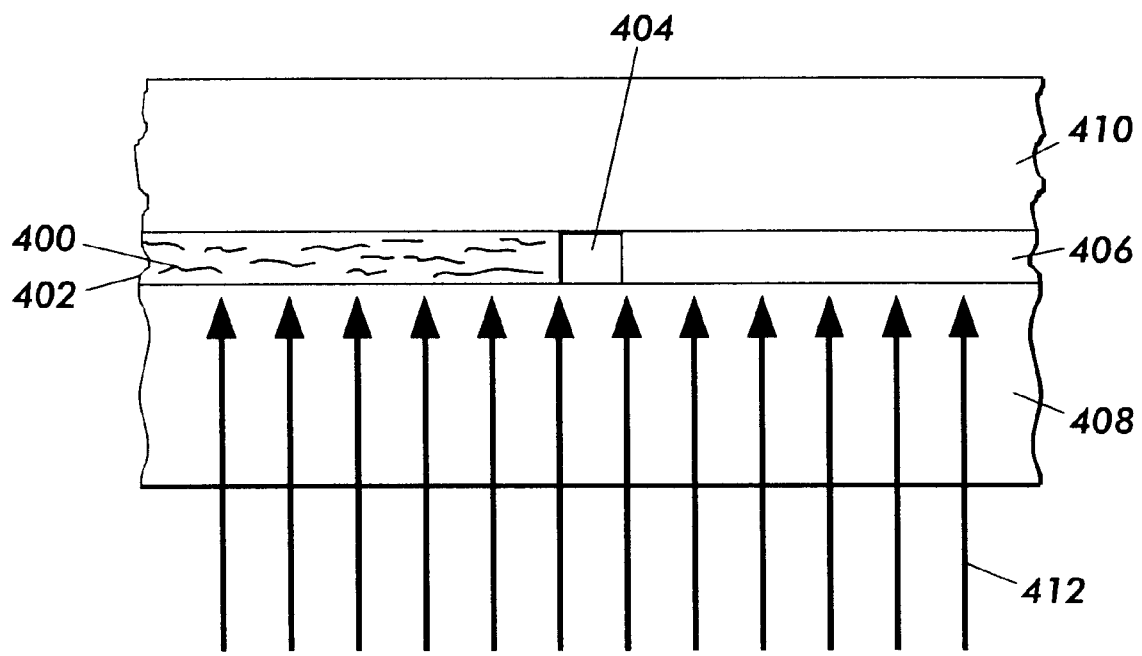
FIG. 21 is a side view of microcracks in gallium nitride substrates between a support substrate and a sapphire substrate.

Similarly, in the simplified structure of FIG. 21, microcracks 400 in a first GaN substrate 402 will terminate at the trench 404 before reaching the second GaN substrate 406 as the two substrates are bonded between the sapphire substrate 408 and the Si support substrate 410. The microcracks 400 will form in the GaN substrate 402 due to biaxial and thermoplastic stress during laser 412 lift-off and separation of the GaN substrates 404 and 406 from the sapphire substrate 408.

The advantages for obtaining single crystal GaN substrates include the ability to subsequently deposit homoepitaxial GaN-based thin film devices onto a GaN substrate and simplified cleaving of mirror facets in laser diode applications.

Cracking within GaN substrates due to stress during growth of the GaN layer or later during due to stress from the laser lift-off is isolated with stripe trenches. The donor sapphire substrates are reusable.

Removal of the insulating sapphire substrate from the grown GaN substrate simplifies providing electrical contacts to the resulting GaN substrate for nitride based semiconductor laser structures subsequently grown on the GaN substrate. Contacts can be deposited on both sides of a more electrically conductive GaN substrate or the GaN substrate may be used as a contact on its own while contacts can only be deposited on one side of an insulating sapphire substrate. This single side contact sapphire substrate configuration complicates contact and packaging schemes, resulting in a spreading-resistance penalty and increased operating voltages.

The use of the thermally conductive GaN substrate also allows a superior heat sink to be attached to the laser diode arrays.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for making a gallium nitride substrate for a nitride based semiconductor structure comprising the steps of:

depositing a gallium nitride layer on a sapphire substrate;

etching at least one trench through said gallium nitride layer to said sapphire substrate, said at least one trench dividing said gallium nitride layer into a plurality of gallium nitride substrates;

attaching a support substrate to a side of said plurality of gallium nitride substrates opposite said sapphire substrate;

removing said sapphire substrate from said plurality of gallium nitride substrates; and removing said support substrate from said plurality of gallium nitride substrates.

2. The method of claim 1 wherein the step of attaching said support substrate to said side of said plurality of gallium nitride substrates includes using glue to attach said support substrate to said plurality of gallium nitride substrates.

3. The method of claim 1 wherein the step of removing said sapphire substrate includes exposing said sapphire substrate to laser light.

4. The method of claim 3 wherein the step of removing said sapphire substrate includes polishing of said sapphire substrate prior to exposure to laser light.

5. The method of claim 1 wherein said support substrate includes a material selected from the group consisting of silicon and gallium arsenide or other rigid support material.

6. The method of claim 1 further comprising the step of patterning said gallium nitride layer after deposition of said gallium nitride layer on said sapphire substrate, said plurality of gallium nitride substrates formed underneath said patterning, said etching occurring between said patterning.

7. A method for making a gallium nitride substrate for a nitride based semiconductor structure comprising the steps of:

depositing a first gallium nitride layer on a sapphire substrate;

patterning said first gallium nitride layer, depositing a second gallium nitride layer on said first gallium nitride layer through opening in said patterning, said second gallium nitride layer overgrowing said patterning to form at least one trench through said second gallium nitride layer to said sapphire substrate, said at least one trench dividing said second gallium nitride layer into a plurality of gallium nitride substrates;

attaching a support substrate to a side of said plurality of gallium nitride substrates opposite said sapphire substrate;

removing said sapphire substrate from said plurality of gallium nitride substrates; and removing said support substrate from said plurality of gallium nitride substrates.

8. The method of claim 7 wherein the step of attaching said support substrate to said side of said plurality of gallium nitride substrates includes using glue to attach said support substrate to said plurality of gallium nitride substrates.

9. The method of claim 7 wherein the step of removing said sapphire substrate includes exposing said sapphire substrate to laser light.

10. The method of claim 9 wherein the step of removing said sapphire substrate includes polishing of said sapphire substrate prior to exposure to laser light.

11. The method of claim 1 wherein said support substrate includes a material selected from the group consisting of silicon and gallium arsenide or other rigid supporting material.

* * * * *